(12) United States Patent
Berranger et al.

(10) Patent No.: US 6,307,492 B1
(45) Date of Patent: Oct. 23, 2001

(54) DEVICE TO COMPENSATE FOR THE NON-LINEARITY OF AN ANALOG/DIGITAL CONVERTER

(75) Inventors: Robert Berranger, Le Perray en Yvelines; Jean-Luc de Gouy, Briis S/S Forges, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/576,441

(22) Filed: May 22, 2000

(30) Foreign Application Priority Data

May 28, 1999 (FR) .................................................. 99 06793

(51) Int. Cl.$^7$ ................................................ H03M 1/20
(52) U.S. Cl. ......................... 341/131; 341/116; 341/155
(58) Field of Search ........................ 341/131, 155–158, 341/129, 132, 142, 126, 116, 115, 120, 118, 111, 110, 123; 332/110

(56) References Cited

U.S. PATENT DOCUMENTS

| 4,812,846 | * | 3/1989 | Noro ..................................... 341/131 |
| 4,937,576 | * | 6/1990 | Yoshio et al. ........................ 341/131 |
| 5,525,984 | * | 6/1996 | Bunker ................................. 341/131 |
| 5,729,182 | * | 3/1998 | Fousset et al. ...................... 332/100 |
| 6,016,113 | * | 1/2000 | Binder ................................. 341/131 |

FOREIGN PATENT DOCUMENTS 2 235 599 * 3/1991 (GB) .

OTHER PUBLICATIONS

James S. Epstein, et al., "Hardware Design for a Dynamic Signal Analyzer," Hewlett Packard Journal, vol. 35, No. 12, (Dec. 1984), pp. 12–17.*

* cited by examiner

Primary Examiner—Brian Young
Assistant Examiner—John Nguyen
(74) Attorney, Agent, or Firm—Oblon, Spivak, McClelland, Maier & Neustadt, P.C.

(57) ABSTRACT

The method consists of the adding of a dither signal of constant amplitude, frequency-modulated by noise, to the signal applied to the input of the converter. An automatic control link is set up between the level of the added interference signal and the signal applied to the input of the converter so that the level of the input signal added to the level of the added interference signal is equal to the level of the full scale signal of the converter. Application to digital communications radio receivers.

10 Claims, 2 Drawing Sheets

DEVICE TO COMPENSATE FOR THE NON-LINEARITY OF AN ANALOG/DIGITAL CONVERTER

BACKGROUND OF THE INVENTION

1. Field of the Invention

The present invention relates to a device to compensate for the non-linearity of an analog/digital converter. It can be applied to the making of digital communications receivers.

A major characteristic of radio receivers is their capacity to demodulate weak signals in the presence of high-amplitude disturbing signals. This capacity is qualified by an instantaneous dynamic range and is measured in decibels.

2. Description of the Prior Art

In analog receivers, the instantaneous dynamic range is obtained by narrow-band filtering upline from the amplifier system, and may reach up to 120 dB.

By principle, wide-band digital receivers do not have any narrow frequency band filter placed before the analog/digital filter. The effect of this is to greatly reduce the dynamic range of the receivers and cause distortions in the demodulated signal.

The dynamic range of the analog/digital converters used is about 70 dB. Their spurious-free dynamic range or S.F.D.R. is 80 dB in relation to the full scale or FS of the converter. This dynamic range varies as a function of the level of the signal applied to the converter, for example for signals at −20 dB of the full scale the dynamic range is limited to 20 dB.

The distortions of the demodulated signal are produced by lack of precision in conversion since the steps of a converter do not all have the same analog value. The differences from one step to another may indeed attain plus or minus 50%. This non-linearity, which is known in the literature as "differential linearity" is said to be coarse as opposed to the non-linearity of analog circuits which is smooth. For an analog/digital converter, there is actually a multitude of curves with differential linearities of the type shown in FIG. 1. This figure shows an intermodulation distortion curve in two tones that are equal as a function of the level of the signal applied to the input of an analog/digital converter. These two tones depend both on the absolute frequency of the signal and its ratio with the clock signal.

A known method of compensating for the non-linearity of a digital-analog converter consists of the adding, to the signal applied to the input of the converter, of a noise signal called dither, having special characteristics. The efficiency of the method is not optimal for correcting the non-linearity of analog/digital converters of digital radio receivers with wide frequency bands extending over several tens of MHz and low modulation frequency bands of some tens of kHz. Thus for example, by adding a dither signal at −35 dB/FS in terms of mean power, the distortion curve of FIG. 1 is improved as shown in FIG. 2 for peak levels of −10 dB/FS to −25 dB/FS. This improvement is even more marked for the lower levels. It can also be seen that the roughness has diminished. However, the third-order intermodulation (IMD3) remains always below −80 dBc.

An even closer examination of the curve of FIG. 2 shows that, to obtain the benefit of maximum linearity, it would be appropriate to position the interference signal at the full scale of the converter. This would mean increasing the gain by about 20 dB in the analog part of the receiver located before the converter, although this is not justified by the noise floor of the converter and could lead to instability in the receiver through the increase resulting therefrom in the dynamic range of the automatic gain control (AGC) analog loop placed before the converter. However, because of the stepped management of the AGC loop and because of the hysteresis needed, it is practically impossible to position the signal at a value outside the upper limit of window of −3 dB to −8 dB of the full scale. This means a corresponding loss in the instantaneous dynamic range. Finally, the fact of positioning the natural interference signals at the maximum of the full scale leaves no margin whatsoever, and the pulsed noises are clipped by the converter with the resulting inconvenience.

SUMMARY OF THE INVENTION

The aim of the invention is to overcome the above-mentioned drawbacks.

To this end, an object of the invention is a method for the linearizing of an analog/digital converter, comprising at least one step where a dither signal of constant amplitude, frequency-modulated by noise, is added to the signal applied to the input of the converter.

According to a second characteristic, the method according to the invention also comprises a step for setting up an automatic control link between the level of the added interference signal and the signal applied to the input of the converter so that the resultant level is equal to the level of the full-scale signal of the converter.

An object of the invention is also a device for the implementation of the above-mentioned method.

The method and device according to the invention have the advantage of providing a solution to the linearization of digital receivers when the linearity depends on that of the analog/digital converter. The method implemented by the invention has a universal character inasmuch as it can be applied to every kind of analog/digital converter.

BRIEF DESCRIPTION OF THE DRAWINGS

Other features and advantages of the invention shall appear from the following description, made with reference to the appended drawings, of which.

MORE DETAILED DESCRIPTION

Figure 1:
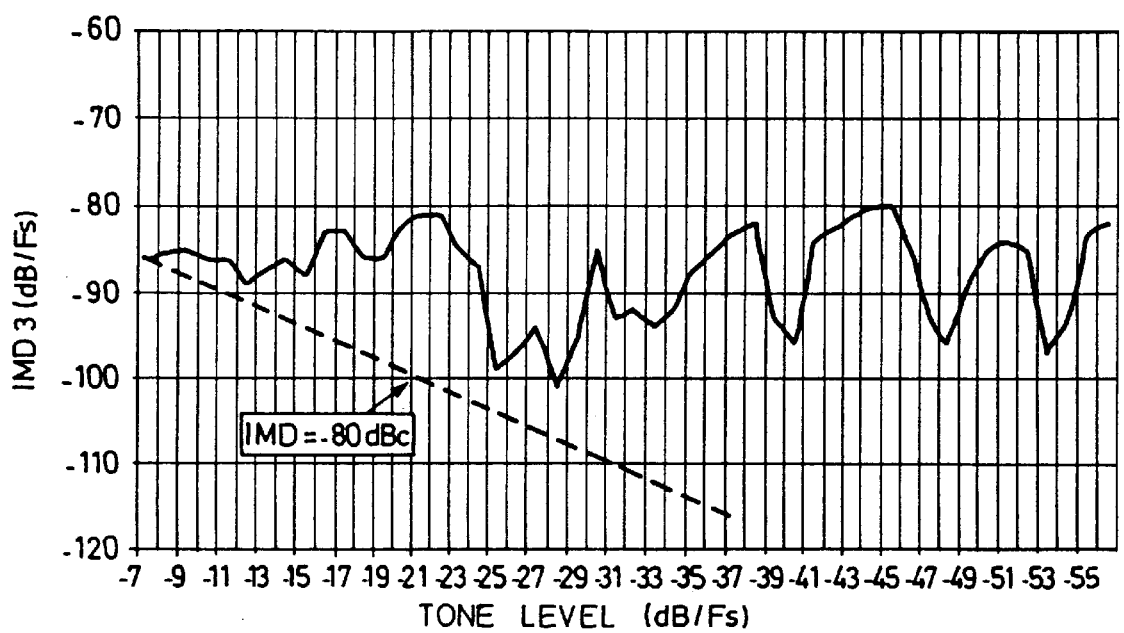
FIG. 1 is a curve showing the fluctuations of the third-order intermodulation level as a function of the level of the tones without correction by the addition of dither according to the prior art.
Figure 2:
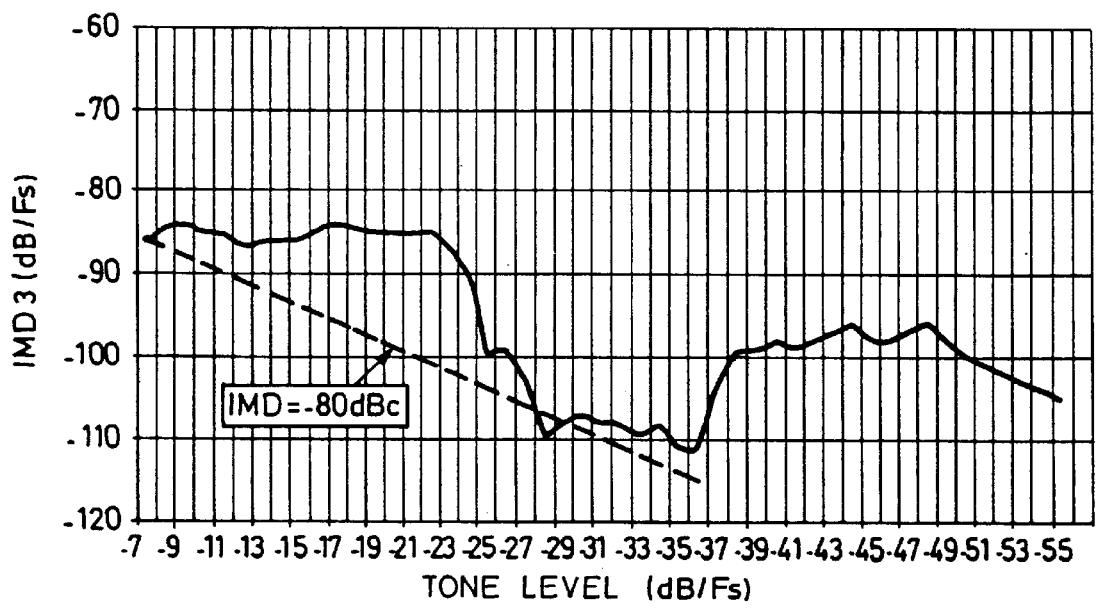
FIG. 2 is a curve showing the fluctuations of the third-order intermodulation level obtained by the adding, to the signal applied to the input of the converter, of a dither outside the frequency band of the useful signal according to the prior art.

To ensure that the sum of the interference signals is equally distributed over the full scale of an analog/digital converter in order to smoothen the non-linearities of this converter, the method according to the invention consists in adding an additional interference signal with an amplitude such that the level of the useful signal superimposed on the natural interference signals and added to the level of the added interference signal corresponds to the full scale of the analog/digital converter. The spectrum of the added interference signal is that of a white noise. This makes it completely decorrelated from both the useful signal and the natural interference signals, its width being at least equal to that of the interference signals.

This approach makes it possible to bring the lines that are the boundaries of the spurious-free dynamic range to a relative level corresponding to that of the full scale. The spurious-free dynamic range can furthermore be increased by the line-spread effect obtained by widening the noise band of the added interference signal. This is obtained at the cost of a slight rise in the floor noise which is not troublesome so long as it is below the S.F.D.R. noise. The result obtained will then especially beneficial as the level of the signal of the added interference signal is preponderant at the input of the analog/digital converter. Since it is also necessary to increase the dynamic range for high levels of the natural interference signals that are sufficiently above the noise of the analog/digital converter, optimum levels can be found for the two types of interference signals by positioning the AGC.

If we take for example the case of an analog/digital converter with an S.F.D.R. of 80 dB and a signal-to-noise ratio of 68 dB, sampled at 65 MHz, the noise reduced to a 3 kHz frequency band is then equal to:

$$-68 - 10 \, LOG\left[\frac{65000}{3}\right] = -111 \text{ dB full scale.}$$

For natural interference signals at −20 dB of the full scale (10%), the added interference signal will be at −1 dB of the full scale (80%). The dynamic range (natural interference signals to noise) will then be −20−(−111)=91 dB.

To obtain this result, the frequency band of the added interference signal must be equal to ten times that of the natural interference signal.

Assuming that the band of the natural interference signal is 3 kHz, which corresponds to that of the majority of the input signals in the HF range, this leads to the use of an added interference signal occupying a minimum frequency band of 30 kHz.

All the above considerations lead the method according to the invention to meet the following three criteria which are as follows:

a) in order to work permanently at the full scale of the analog/digital converter, the added interference signal must preferably have an automatic control link with the level of the signal coming from the input of the receiver, with a passband of the automatic control link that is at least equal to the passband of the modulation, b) the added interference signal must have constant amplitude so as not to clip the noise spikes, and reduce the signal-to-noise ratio SNR of the analog/digital converter. This entails the use of a carrier that is frequency modulated by white noise, c) the frequency band of the added interference signal must be outside the useful band and sufficiently filtered so as not to encroach on the useful band with a level higher than that of the noise of the analog/digital converter, i.e. −110 dB in the above example.

Figure 3:
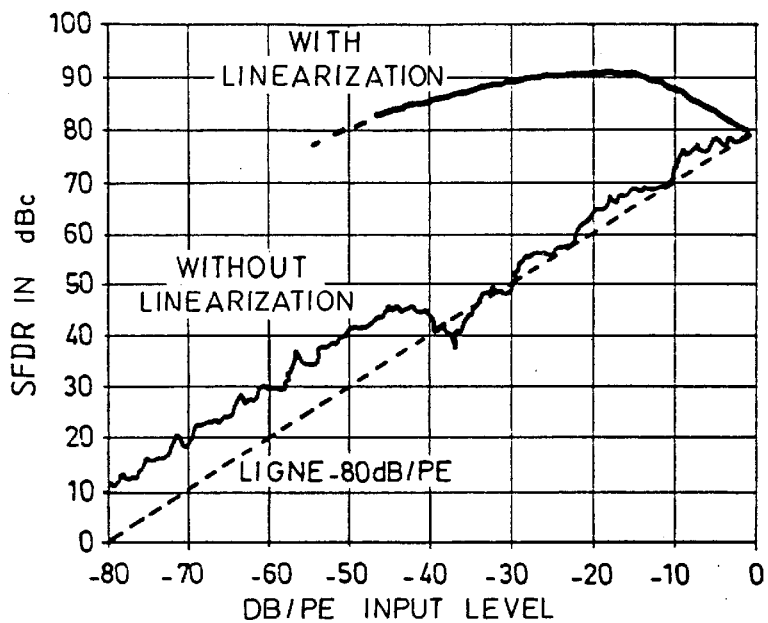
FIG. 3 shows two curves representing the S.F.D.R. level as a function of the level of the input signal applied to the converter obtained without linearization or with linearization according to the invention.

The curves of FIG. 3 show the result that can be obtained by applying the method according to the invention for the linearizing of an analog/digital converter of the type known under the reference AD6640 commercially distributed by the U.S. company "ANALOG DEVICES".

Figure 4:
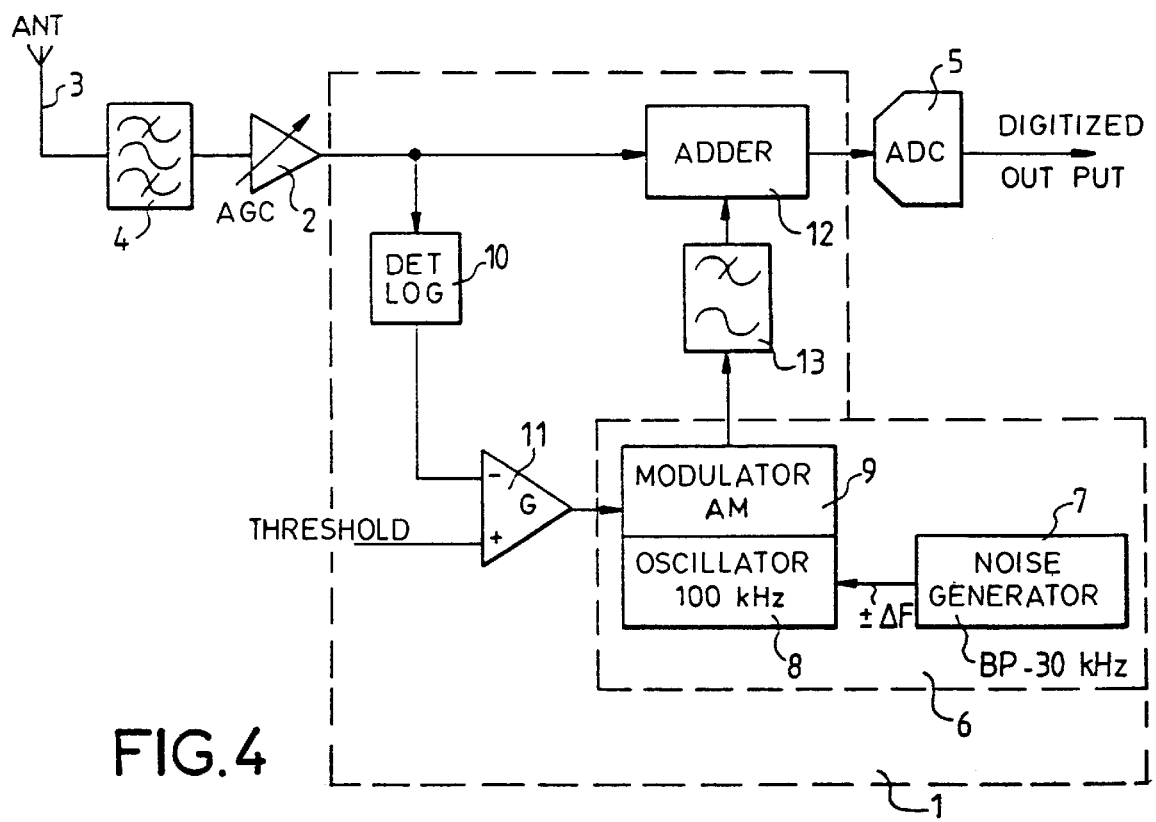
FIG. 4 shows an embodiment of a linearization device according to the invention.

A device to implement the method of the invention that meets the above three criteria is shown in FIG. 4 within a box of dashes 1 inserted in the reception sequence of a radio receiver between, firstly, the output of a reception amplifier 2 receiving the signals of an antenna 3 through a band filter 4 and, secondly, an analog/digital converter 5.

The device 1 comprises an interference signal stage 6 also shown within a box of dashes. The stage consists of a noise generator 7, a variable frequency oscillator 8 and an amplitude modulation stage 9. The oscillator 8 is frequency modulated by the white noise given by the noise generator 7, and the level of the resulting signal given by the oscillator 8 is amplitude modulated by the modulation stage 9 as a function of the level of the signal obtained at the output of the reception amplifier 2. The output level of the reception amplifier 2 is applied to the modulation stage 9 through a detection cell 10 and a differential amplifier 11. An adder circuit 12 adds the signal obtained at the output of the reception amplifier 2 to the noise level modulated by the modulation device 9 and filtered through a lowpass filter 13 interposed between the output of the modulation device 9 and the adder 12. The signal coming from the adder circuit 12 is then transmitted to the analog/digital converter 5.

In another embodiment of the invention, it can be envisaged that the added interference signal will not be automatically controlled. This can be achieved by positioning it for example at only 30% of the full-scale value of the analog/digital converter. The total dynamic range will then be reduced by 3 dB and the gain in linearity will be lower but this arrangement could still be appropriate in many cases.

What is claimed is:

1. A method for linearizing an analog to digital converter, comprising:

receiving an analog signal to be converted by the analog to digital converter;

generating a noise signal having a constant amplitude; frequency modulating said noise signal with a carrier signal to produce an interference signal having a constant amplitude; and adding the interference signal to the analog signal prior to inputting the analog signal to the analog to digital converter.

2. The method of claim 1, further comprising providing an automatic control link between the interference signal and the analog signal so that the level of the analog signal added to the interference signal is substantially equal to a full scale of the analog to digital converter.

3. The method of claim 1, wherein a frequency band of the interference signal is outside the useful band of the analog signal.

4. The method of claim 2, wherein a frequency band of the interference signal is outside the useful band of the analog signal.

5. An apparatus for linearizing an analog to digital converter, comprising:

a device configured to receive an analog signal to be converted by the analog to digital converter;

a noise generating circuit configured to generate noise signal having a constant amplitude;

a frequency modulator configured to frequency modulate said noise signal with a carrier to produce an interference signal having a constant amplitude;

an adder circuit coupled to said device, said adder circuit being configured to add the interference signal to the analog signal prior to inputting the analog signal to the analog to digital converter.

6. The apparatus of claim 5, further comprising a control circuit configured to control the amplitude of the interference signal as a function of an amplitude of the analog signal so that the level of the interference signal added to the analog signal is substantially equal to a full scale of the analog to digital converter.

7. The apparatus of claim 5, wherein the interference generating circuit comprises:

a white noise generator configured to generate a white noise signal;

variable frequency oscillator coupled to said white noise generator and configured to output an oscillator frequency which is frequency modulated by said white noise signal; and a modulation circuit configured to input said oscillator frequency which is frequency modulated by said white noise signal, and to output a signal that is amplitude modulated as a function of said analog signal.

8. A radio receiver for converting a received analog signal into a digital signal, comprising:

a device configured to receive an analog signal to be converted by the analog to digital converter;

a noise generating circuit configured to generate a noise signal having a constant amplitude;

a frequency modulator configured to frequency modulate said noise signal with a carrier to produce an interference signal having a constant amplitude;

an adder circuit coupled to said device, said adder circuit being configured to add the interference signal to the analog signal prior to inputting the analog signal to the analog to digital converter.

9. An apparatus for linearizing an analog to digital converter, comprising:

means for receiving an analog signal to be converted by the analog to digital converter;

means for generating a noise signal having a constant amplitude;

means for frequency modulating said noise signal with a carrier to produce an interference signal having a constant amplitude; and means for adding the interference signal to the analog signal prior to inputting the analog signal to the analog to digital converter.

10. The apparatus of claim 9, further comprising means for controlling the signal level of the interference signal so that the level of the analog signal added to the interference signal is substantially equal to a full scale of the analog to digital converter.

* * * * *